(12) United States Patent
Ganapathiraman et al.

(10) Patent No.: US 7,081,674 B2
(45) Date of Patent: Jul. 25, 2006

(54) POLYELECTROLYTE NANOLAYERS AS DIFFUSION BARRIERS IN SEMICONDUCTOR DEVICES

(75) Inventors: Ramanath Ganapathiraman, Clifton Park, NY (US); Ravindra S. Kane, Niskayuna, NY (US); Gopal Ganesan Pethuraja, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 85 days.

(21) Appl. No.: 10/866,005

(22) Filed: Jun. 11, 2004

(65) Prior Publication Data

US 2005/0001317 A1 Jan. 6, 2005

Related U.S. Application Data

(60) Provisional application No. 60/478,640, filed on Jun. 13, 2003.

(51) Int. Cl.
*H01L 23/48* (2006.01)

(52) U.S. Cl. .................. 257/751; 257/753; 257/762

(58) Field of Classification Search ............... 257/751, 257/753, 762
See application file for complete search history.

(56) References Cited

U.S. PATENT DOCUMENTS

| | | | |
|---|---|---|---|
| 5,164,332 A | 11/1992 | Kumar | |
| 5,958,996 A | 9/1999 | Egitto | |
| 6,469,385 B1 * | 10/2002 | Avanzino et al. | ........... 257/741 |
| 6,503,835 B1 | 1/2003 | Lee | |
| 6,521,300 B1 | 2/2003 | Hsieh | |
| 6,806,344 B1 | 10/2004 | Sezi | |
| 2002/0105081 A1 | 8/2002 | Ramanath | |

OTHER PUBLICATIONS

Sun et al., "How Pore Size and Roughness Affect Diffusion Barrier Continuity on Porous low-k Films," *J Electrochem Society*, 150157:F97-F101.

Ganesan et al., "Polyelectrolyte nanolayers as diffusion barriers for Cu metallization," *Appl. Physics Lett*, 83(16): 3302-3304 (Oct. 20, 2003).

(Continued)

*Primary Examiner*—Gene M. Munson
(74) *Attorney, Agent, or Firm*—David J. Aston; Peters Verny Jones Schmitt & Aston, LLP

(57) ABSTRACT

The present invention provides a diffusion barrier useful in an integrated circuit, which serves to prevent the migration of material from a conductive layer to the underlying substrate and further provides improved adhesion of the conductive layer to the substrate. The diffusion barrier comprises a polymer which is a polyelectrolyte, having both cationic and anionic groups along its backbone chain. Preferred polyelectrolyte barriers are polyethyleneimine (PEI) and polyacrylic acid (PAA). Other polyelectrolytes may be used, such as those that contain SH—OH— aromatic groups, or those that can interact with either the metal or the adjacent layers via covalent interactions and cross-linking (e.g., POMA, PSMA). The polymeric layer may be applied in two coatings, so that the amine side chains contact the dielectric (e.g. silicon) substrate and the acidic groups are adjacent to the overlying metallic interconnect (e.g. copper). The diffusion barrier may be made thin, preferably less than 5 nm thick, which is advantageous in devices having high aspect ratios.

24 Claims, 5 Drawing Sheets

OTHER PUBLICATIONS

Singh et al., "Semiconductor Manufacturing is the 21st Century," *Semiconductor Fabtech*, Mar. 1999, pp. 223-233.
Decher, "Fuzzy Nanoassemblies: Toward Layered Polymeric Multicomposites," *Science*, 227:1232-1237 (1997).

Krishnamoorthy et al.,"Self-assembled near-zero-thickness molecular layers as diffusion barriers for Cu metallization," *App. Phys. Lett*, 78(17):2467-2469 (Apr. 2001).

* cited by examiner

POLYELECTROLYTE NANOLAYERS AS DIFFUSION BARRIERS IN SEMICONDUCTOR DEVICES

RELATED CASES

This application is related to and claims priority to provisional Application No. 60/478,640, entitled "Polyelectrolyte nanolayers as diffusion barriers for Cu metallization," naming G. Ramanath et al. as inventors and filed Jun. 13, 2003. This application is incorporated herein for all purposes as if set forth herein in full.

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

A. Field of the Invention

The present invention generally relates to integrated circuits. In particular, it relates to forming a diffusion barrier layer comprising a polyelectrolyte monolayer, bilayer, or multilayers in order to prevent diffusion of a metal interconnect (e.g. copper) into a semiconductor or insulating material (e.g. Si or $SiO_2$).

B. Description of Related Art

In order to achieve the increasing demands for semiconductor performance, many new manufacturing techniques are being developed and introduced. Increasing demands are resulting in shrinking dimensions in order to accommodate more circuits on a chip, and increasing operating speeds, which approach the inherent delay in traditional semiconductor materials.

Copper is the preferred metal for creating multilevel interconnect structures in ultra-large-scale-integrated (ULSI) circuits because of its high electrical conductivity and electromigration resistance [Ref. 1]. As a conductor, Cu has a lower resistivity and higher electromigration resistance than traditional Al—Si—Cu alloy and can also reduce costs because smaller lines can be used to carry the same amount of current. As a result, tighter packing density can be achieved on a given semiconductor level. Furthermore, the use of many low dielectric-constant materials such as fluorinated $SiO_x$ is critical for achieving greater device speeds. (W. Chang, S. M. Jang, C. H. Yu, S. C. Sun, and M. S. Liang, San Francisco, Calif., USA, 1999 (IEEE, Piscataway, N.J.), p. 295, 131–3; G. S. Chen and S. T. Chen, J. Appl. Phys. 87, 8473 (2000).) It is thus crucial to devise solutions to prevent Cu diffusion across $SiO_x$-based materials.

The traditional dielectric, silicon dioxide (k=3.9), can be replaced by low k materials (k of about 1.2 to 3.0). The integration of copper with porous ultralow k interlayer dielectrics has attracted significant interest because the combination will lead to additional performance improvements in reducing the resistance-capacitance (RC) time delay of integrated circuits. However, copper diffuses rapidly in silicon, silicon dioxide and other low k materials. Many low-k materials have been proposed for use in semiconductor devices, such as fluorine-doped $Sio_2$, methyl silsesquioxane (MSQ), hydrogen silsesquioxane (HSQ), parylene, and benzocyclobutene polymers. The diffusion, over time, through the dielectric material, results in junction linkage, which decreases device efficiency.

One of the challenges in Cu metallization technology is to prevent the rapid diffusion of Cu into $SiO_2$ under an electrical bias during device operation. This is because Cu incorporation degrades the dielectric properties of the oxide layer, causing leakage currents and leading to inferior device performance and failure. (J. D. McBrayer, R. M. Swanson, and T. W. Sigmon, J. Electrochecm. Soc. 133, 1243 (1986).)

To address the problem of copper diffusion, researchers have developed "diffusion barriers." A diffusion barrier is part of the metallization scheme, comprising a layer of material formed between an overlying copper layer and an underlying silicon or silicon dioxide layer. The diffusion barrier serves to inhibit the diffusion of copper into the surrounding layer. The problems associated with ultrathin (1–10 nm) diffusion barriers are disclosed in Sun et al., "How Pore Size and Surface Roughness Affect Diffusion Barrier Continuity on Porous Low-k Films," J. Electrochemical Society 150(5)F97-F101 (2003). The diffusion barrier studied was tantalum (Ta). Ta has many good properties as a diffusion barrier because it has a high melting point and therefore a high activation energy for diffusion.

Several researchers have advocated the use of congruent 10 to 30-nm-thick diffusion barrier layers of Ti- or Ta-based compounds or Cu-based alloys to alleviate this problem. (C. Ahrens, D. Depta, F. Schitthelm, and S. Wilhelm, Appl. Surf. Sci. 91, 285–90 (1995); P. J. Ding, W. A. Lanford, S. Hymes, and S. P. Murarka, Appl. Phys. Lett. 64, 2897 (1994); and, P. J. Ding, W. A. Lanford, S. Hymes, and S. P. Murarka, Appl. Phys. 75, 3627 (1994).) While this approach has been successful thus far, new types of barriers are likely to be needed at device dimensions below 100 nm in contemporary device architectures, and very high-aspect ratio structures in 3D-integration of multiple-wafer devices. The barrier layer thickness should be kept below 5 nm for future devices to fully realize the advantage of high conductivity Cu. This is difficult to achieve by conventional physical and chemical vapor deposition methods without compromising either conformal coverage of high aspect ratio features and/or the barrier layer microstructure, both of which reduce the efficacy of the barrier. (A. Z. Moshfegh and O. Akhavan, Thin Solid Films 370, 10 (2000); A. Sekiguchi, J. Koike, and K. Maruyama, J. Japan Inst. Metals 64, 379 (2000).)

The use of amorphous alloys as diffusion layers has been discussed. Amorphous binary silicides, such as molybdenum-, tantalum and tungsten silicide and amorphous ternary alloys (e.g., Ti—Si—N) have been reported as diffusion barriers. The formation of these layers, however, uses sophisticated sputtering processes and results in the inclusion of substantial contaminants.

Diffusion barriers made of TiN, TiSiN and TiN/TiSiN have also been reported. The titanium was deposited by sputtering in the presence of ammonia, which was used as a nitridation agent. A two-step annealing process completed the layer formation. Currently used interfacial barrier layers based on transition metals or their compounds [Ref. 2], formed by conventional vapor deposition methods, do not form uniform and continuous films at thicknesses below 10 nm, especially in non-planar topographies with high (e.g., 5:1) depth-to-width aspect ratios. Such high barrier layer thicknesses of these high-resistivity materials take up the space meant for low-resistivity Cu, thereby neutralizing the advantages of Cu metallization in sub-100-nm devices. Furthermore, even if <5-nm-thick conformal films are achieved, it is not clear if conventional barrier materials will be effective at these thicknesses due to fast diffusion paths such as nanopipes [Ref. 3], or grain boundary generation due to phase formation or compositional changes caused by interfacial intermixing.

While a number of diffusion barriers have been discussed in the art, improved diffusion barriers are always desirable, especially diffusion barriers that are formed in very thin (nanometer-scale) layers.

The shrinking dimensions of semiconductor circuits also causes a high aspect ratio (i.e. small feature size and deep trenching) in the surface topology of the chip. This means that a diffusion barrier that is used must have good continuity and conformality in order to act as a viable diffusion barrier. In addition, the barriers must be very thin in order to maintain the advantage of low effective resistance or capacitance achieved through combination of Cu and low-k materials.

Researchers including the present inventors have recently demonstrated [Refs. 4,5] the use of sub-5-nm self-assembled layers of short (few nm) amphiphilic organosilane molecules as diffusion barriers. The underlying rationale of this work was to immobilize Cu through strong local interfacial bonding with short-chained molecular moieties that are organized on the substrate in an ordered fashion, and create a vacuum-like potential barrier between the Cu and the dielectric to prevent Cu ionization and transport. These molecules are anchored to substrate (and/or the overlayer) typically only at one point. The work referred to above as involving (in one embodiment) amphiphilic organosilanes was described in Ramanath et al. US PGPUB 2002/0105081 A1.

The present invention comprises the use of layers of oligomers and polymers (long-chained molecules) with multiple points at which the layer is electrostatically or covalently anchored to the underlayer and/or the overlayer. While such layers are typically disordered, ordered configurations are also conceivable. As described below, one embodiment of the invention involves the use of 3 to 5-nm-thick polyelectrolyte bilayers and multilayers to inhibit Cu diffusion across dielectrics. It is well known that polyelectrolytes can immobilize metal-ions through electrostatic, covalent or coordinate-covalent bonding interactions, which can be tuned by appropriate choice of functional groups [Refs. 6,7,8,9,10,11,12]. As described herein, alternating electrostatic adsorption of polycations and polyanions is a convenient, versatile technique for forming ultrathin films, and allows the exploration of multilayers as barriers [Refs. 13, 14]. Furthermore, the use of polymeric structures as barriers could open up possibilities of integrating them, or their constituents, with low-k dielectric materials or their precursors, thereby obviating the need for barriers for Cu/low-k metallization technology.

SUMMARY OF THE INVENTION

The present invention provides a diffusion barrier useful in an integrated circuit, which serves to prevent the migration of material from a conductive layer to the underlying substrate and further provides improved adhesion of the conductive layer to the substrate. The diffusion barrier comprises a polymer which is a polyelectrolyte, having both cationic and anionic groups along its backbone chain. Preferred polyelectrolyte barriers are polyethyleneimine (PEI) and polyacrylic acid (PAA). Other polyelectrolytes may be used, such as those that contain SH—, OH—, aromatic groups, or those that can interact with either the metal or the adjacent layers via covalent interactions and cross-linking (e.g., POMA, polyoctadecene maleic anhydride, PSMA, polystyrene maleic anhydride, etc.). The polymeric layer may be applied in two coatings, so that the amine side chains contact the dielectric (e.g. silicon) substrate and the acidic groups are adjacent to the overlying metallic interconnect (e.g. copper). The diffusion barrier may be made thin, preferably less than 5 nm thick, which is advantageous in devices having high aspect ratios.

Accordingly, there is provided an electrical device comprising a substrate, such as a semiconductor material; at least one polyelectrolyte layer on the substrate; and a conductive metal layer (e.g. copper) on the polyelectrolyte layer(s). The substrate may preferably be functionalized to possess a surface charge which attracts an adjacent polyelectrolyte layer. In one aspect of the invention, the substrate has a negative surface charge (e.g. through ozone or plasma surface treatment) and a contacting layer comprises a polycationic layer which is self-assembled through immersion in a liquid containing the polymer.

In one aspect of the invention, the conductive material is copper, which has a high diffusion rate during semiconductor operation, especially where the substrate comprises silicon and silicon oxide.

The present device can be fabricated with an effective diffusion barrier that is less than about 5 nanometers thick.

In one aspect, the invention comprises a method comprising the steps of: (a) providing a substrate; (b) forming at least one polyelectrolyte layer on the substrate; and (c) forming a metal layer on the at least one polyelectrolyte layer. This method may comprise using both a a polycation and a second polyelectrolyte layer comprising a polyanion. The polyelectrolyte layer may be formed as less than about 5 (e.g. 2–10) nanometers thick. The metal layer may be a copper layer. The substrate may be a variety of semiconductor materials, especially low k materials such as silicon and silicon oxide.

In one aspect of the invention the method comprises the step of treating the substrate to form hydroxyl groups. Then a step of forming a polycationic layer on the functionalized substrate may be carried out. In another aspect of the invention, the method further comprises forming a polyanionic layer on the polycationic layer.

Another aspect of the invention comprises an integrated circuit comprising a substrate, a metal layer, and a diffusion barrier in between, wherein the diffusion barrier comprises a polymeric layer less than 10 nm thick, wherein said polymeric layer comprises polymers having primary amines contacting the substrate and pendant organic acidic groups contacting the metal. Preferably, the diffusion barrier is less than 5 nm thick. The diffusion barrier may comprise a polyionic layer selected from the group consisting of a polyanionic layer, a polycationic layer, and adjacent polyanionic and polycationic layers.

In a preferred embodiment, the diffusion barrier comprises a polymeric layer that comprises PAA and PEI. The diffusion barrier may comprise a cationic polyelectrolyte containing electron-donating functional groups selected from the group consisting of s mercapto (SH), ethanol (OH), benzyl (C6H5) and carboxyl (COO—). Further, it may comprise an anionic polyelectrolyte selected from the group consisting of polystyrene, maleic anhydride (PSMA), polyoctadecene maleic anhydride (POMA) and PAA. The diffusion barrier is also well suited for uses wherein the diffusion barrier contacts a low k dielectric substrate. As mentioned, it is preferred that the substrate has been treated prior to application of the polyelectrolyte layer to comprise surface anionic groups.

DESCRIPTION OF THE SPECIFIC EMBODIMENTS

General

Definitions

Figure 1:
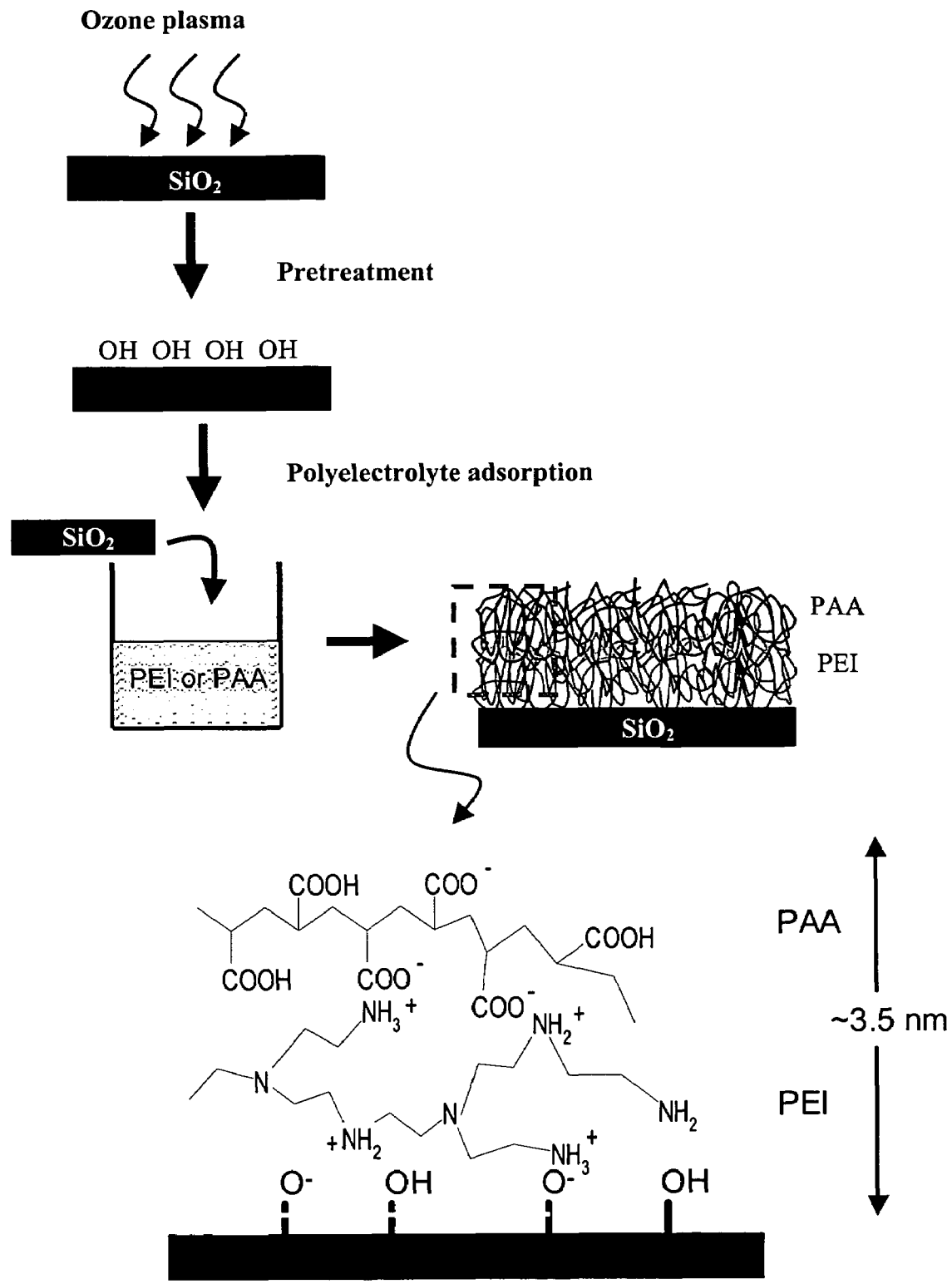
FIG. 1 is a schematic diagram of the sample preparation procedure.

"Polyelectrolyte" means a polymer having monomers comprising anions, cations, or both. A polyelectrolyte is a macromolecular substance which, on dissolving in water or another ionizing solvent, dissociates to give polyions (polycations or polyanions)—multiply charged ions—together with an equivalent amount of ions of small charge and opposite sign. Polyelectrolytes dissociating into polycations and polyanions, with no ions of small charge, are also conceivable. A polyelectrolyte can be a polyacid, a polybase, a polysalt or a polyampholyte.

"Metal" is used in a broader sense than traditional usage—it is used to encompass any "Highly conductive material," that is a material useful as conductor in an integrated circuit and having low resisitivity, i.e. having a resistivity on the same order as copper (at zero degrees Celsius, its resistivity is $1.56 \times 10^{-8}$ ohm meter) and includes materials such as silver and conductive polymers and conducting ceramics (e.g., oxides, carbides, and nitrides such as indium tin oxide, ruthenium oxide, titanium nitride) and alloys.

"PAA" means polyacrylic acid, —[CH$_2$—CH—C(O)OH—]$_n$—, wherein the carboxylic acid moiety C(O)OH represents an anion, and the polymer has a molecular weight determined by n. The preferred "n" for use in the present barriers is 1875. Number average molecular weight is 135,000 and weight average molecular weight is 1,080,000.

"PEI" means polyethyleneimine, more particularly polymers of the formula:

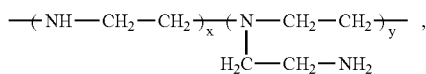

where x and y natural numbers and are indicative of the degree of branching. Typically, PEI is a highly branched polymer with about 25% primary amine groups, 50% secondary amine groups, and 25% tertiary amine groups, with a branching site every 3 to 3.5 nitrogen atoms. The nitrogen atoms must be protonated to achieve cationic charge, so the cationic charge density is pH dependent. This product is sometimes called "pure polyethyleneimine" in order to differentiate it from certain copolymers of ethyleneimine and acrylamide. The primary amines may be alkylated to form a number of derivatives. Preferred number average molecular weight is 60,000 and weight average molecular weight is 750,000.

Cationic polyelectrolytes containing other electron-donating functional groups such as mercapto (SH), ethanol (OH), and benzyl (aromatic) can be used instead of PAA. Additionally, covalently linking polyelectrolytes such as polystyrene maleic anhydride (PSMA) or polyoctadecene maleic anhydride (POMA) can be used. The anhydride groups on PSMA and POMA covalently crosslink with polyelectrolytes such as PEI, and allow subsequent functionalization, e.g., by grafting another layer with a specific functionality on top of it.

"Substrate" means the body or base layer of an integrated circuit, onto which other layers are deposited to form the circuit. The substrate is usually silicon or its oxide, in amorphous, crystalline, or porous forms, although sapphire and other materials as discussed above may also be employed. This term also includes materials modified with other molecular layers such as self-assembled molecular layers.

The present invention generally involves the use of thin polyelectrolyte layers as diffusion barriers and adhesion enhancers in semiconductor structures using highly conductive interconnect metal such as copper (Cu). The preferred diffusion barriers are 3- to 5-nm-thick polyelectrolyte layers comprising polyethyleneimine (PEI) and polyacrylic acid (PAA).

One embodiment of this overall concept is described here in detail, wherein a bilayer of polyethyleneimine (PEI) and polyacrylic acid (PAA) is used to inhibit diffusion and enhance adhesion across a metal dielectric interface. Similarly, monolayers, or multilayers, of polyelectrolytes containing selected functional groups, or multiple groups, can be used to inhibit diffusion and interfacial reaction, and enhance adhesion.

The present structures may be referred to as Cu/PAA/PEI/SiO$_2$/Si capacitor structures in that the presently preferred embodiments comprise these layers in this order. Tests carried out on these devices annealed at 200° C. in a 2 MV cm$^{-1}$ electric field show more than a factor-of-5 increase in Cu diffusion-induced device failure time compared to that observed in Cu/SiO$_2$/Si structures. As described below, increasing the number of PAA/PEI bilayers, with PAA in contact with the Cu overlayer, does not show any further improvement in barrier properties. In contrast, PAA/PEI multilayers with PEI in contact with Cu show only a 2-fold increase in failure time.

Also as discussed below, spectroscopic probing of the Cu/PAA interface reveals that chelation of Cu with carboxyl groups is an important aspect of the present structures. The data contained in the experiments described shows that the present polyelectrolyte nanolayers (having a thickness of less than 10 nm, preferably less than 5 nm and most preferably less than 3 nm) are attractive for applications such as tailoring barrier-less low-k polymeric dielectrics (i.e., dielectrics that do not need a barrier layer), and for isolating nanoscale components in future device systems.

The present methods and devices are consistent with the principle that polyelectrolytes can immobilize metal-ions through electrostatic, covalent or coordinate-covalent bonding interactions, which can be tuned by appropriate choice of functional groups [Refs. 06,7,8,9,10,11,12]. Alternating electrostatic adsorption of polycations and polyanions is a convenient, versatile technique for forming ultrathin films, and allows the exploration of multilayers as barriers [Refs. 13,14]. Furthermore, the use of polymeric structures as barriers could open up possibilities of integrating them, or their constituents, with low-k dielectric materials or their precursors, thereby obviating the need for barriers for Cu/low-k metallization technology.

As described below, the substrate is prepared by a surface treatment that creates surface ions of opposite charge as the next polyionic layer to be applied. If the layer on the substrate is to be polyanionic, the substrate may be treated with ozone, or oxygen plasma to obtain a surface terminated with hydroxyl and oxy groups having a negative charge. Acid treatments or formation of a self-assembled molecular layer assembly (of short-molecules) can also be formed on the substrate surface to enable the anchoring of the polyelectrolyte.

EXAMPLES

1. Substrates and Preparation

The substrates used with the present invention may be any low k semiconductor material. The work described below employed n-type device-quality Si(00) (i.e. a silicon wafer) capped with an 85-nm-thick dry thermal oxide. Each wafer was successively rinsed ultrasonically in acetone, methanol and DI water. A 500-nm-thick Al layer was sputter-deposited in a 5 mTorr Ar plasma after stripping the back oxide with HF, and annealed at 450° C. for 1 hour in a $10^{-6}$ Torr vacuum for ohmic contact formation.

FIG. 1 shows a schematic diagram of the sample preparation procedure. The substrates were hydroxylated by exposure to an ozone plasma for 30 minutes at room tempearature to hydroxylate the substrate prior to polyelectrolyte adsorption.

The $SiO_2$ coated, pre-treated substrate is subjected to coatings of polycationic PEI and polyanionic PAA. The adsorption of these layers onto the substrate results in a PEI layer immediately contacting the $SiO_2$ and a PAA layer above the PEI layer. As detailed in FIG. 1, the polymeric backbone involves interaction of the polymeric side chains with each other, with the pendant —OH groups on the $SiO_2$ surface and the COO$^-$ groups that will bind to the highly conductive metal (Cu).

2. Diffusion Barrier Preparation and Application

PEI was obtained from Sigma-Aldrich® as a 50% (w/v) aqueous solution. The density of the solution is 1.07 g/ml and pH of 1% solution is 10.5 to 11.0. Viscosity is 10,000 to 20,000 cps at 20EC and 20 rpm. Number average molecular weight is 60,000 and weight average molecular weight is 750,000. Product Number is P3143.

PAA was obtained from Acros Organics® as a 25 wt % aqueous solution. The density of the solution is 1.09 g/ml. Number average molecular weight is 135,000 and weight average molecular weight is 1,080,000.

Nanolayers of the polyelectrolyte were produced by successively immersing the wafer in the respective solutions. This technique can be combined with or replaced by spin coating, and subsequent rinsing, and other procedures used to typically prepare films of polymers. Layer thickness of the absorbed layer is controlled by selecting suitable concentration and pH of the polymer solution (dilution), and immersion time. The examples used 10 mM solutions of PEI and PAA, and their pH values are 8.89 and 3.52. They resulted in a layer of thickness ~1.5–2 nm. Thickness can also be controlled by other strategies: e.g., adjusting the ionic strength of the solution, and/or using polyelectrolytes with different molecular weights.

Polymer bilayers of polyethyleneimine (PEI) and polyacrylic acid (PAA) layers were adsorbed onto the $SiO_2$/Si (001)/Al structures by sequential immersion in 10 mM solutions of the respective polyelectrolyte for 20 minutes. PEI was the first layer, i.e., in contact with $SiO_2$, and the PAA polyanion layer was electrostatically attached to PEI. Each adsorption step was followed by a 5-minute water rinse to remove unattached molecules, and the sample was dried gently in flowing $N_2$. The polymer layers were characterized by contact angle measurements, variable angle spectroscopic ellipsometry (VASE), and X-ray photoelectron spectroscopy (XPS). PAA surfaces exhibit contact angles of 34±3° consistent with the hydrophilic characteristics of the constituent carboxyl (—COOH) groups, while PEI surfaces show a significantly higher value of 47±3°.

A 100-nm-thick Cu film was sputter-deposited on the polyelectrolyte bilayers or multilayers through a shadow mask to obtain Cu/polymer/$SiO_2$/Si(001)/Al metal-oxide-semiconductor (MOS) capacitor structures with 1.2-mm-diameter gate-contacts.

Reference samples of Cu/$SiO_2$/Si/Al MOS structures (control sample)—i.e., without the polymer layers—were also fabricated for baseline measurements.

3. Characterization of Diffusion Barriers

A. BTA Testing of Thermal Stability

Bias thermal annealing (BTA) tests on MOS structures having diffusion barriers as described above were carried out in flowing $N_2$ at 200° C. and a 2 MV cm$^{-1}$ electric field. The samples were rapidly cooled to 30° C. at 30-minute intervals to record leakage-current vs. voltage (I-V), and triangular voltage sweep (TVS) characteristics using HP4280 and HP4140 instruments. The C-V and I-V results were similar to what has been reported previously [Refs. 4,5]. As described in Ref. 4, C-V and I-V results in BTA are representative of a structure's resistance to metal diffusion.

Changes in flatband voltage shifts ($\Delta V^{FB}$) obtained from C-V measurement and increases in leakage current density $j_{leakage}$ in Cu/$SiO_2$/Si/Al MOS structures are characteristic signatures of Cu ion diffusion into $SiO_2$. Comparisons of $\Delta V^{FB}$ and $j_{leakage}$ characteristics of Cu/PAA/PEI/$SiO_2$/Si/Al structures and reference structures without the polymer bilayer indicate that the PEI/PAA bilayer inhibits Cu diffusion into $SiO_2$.

Figure 2:
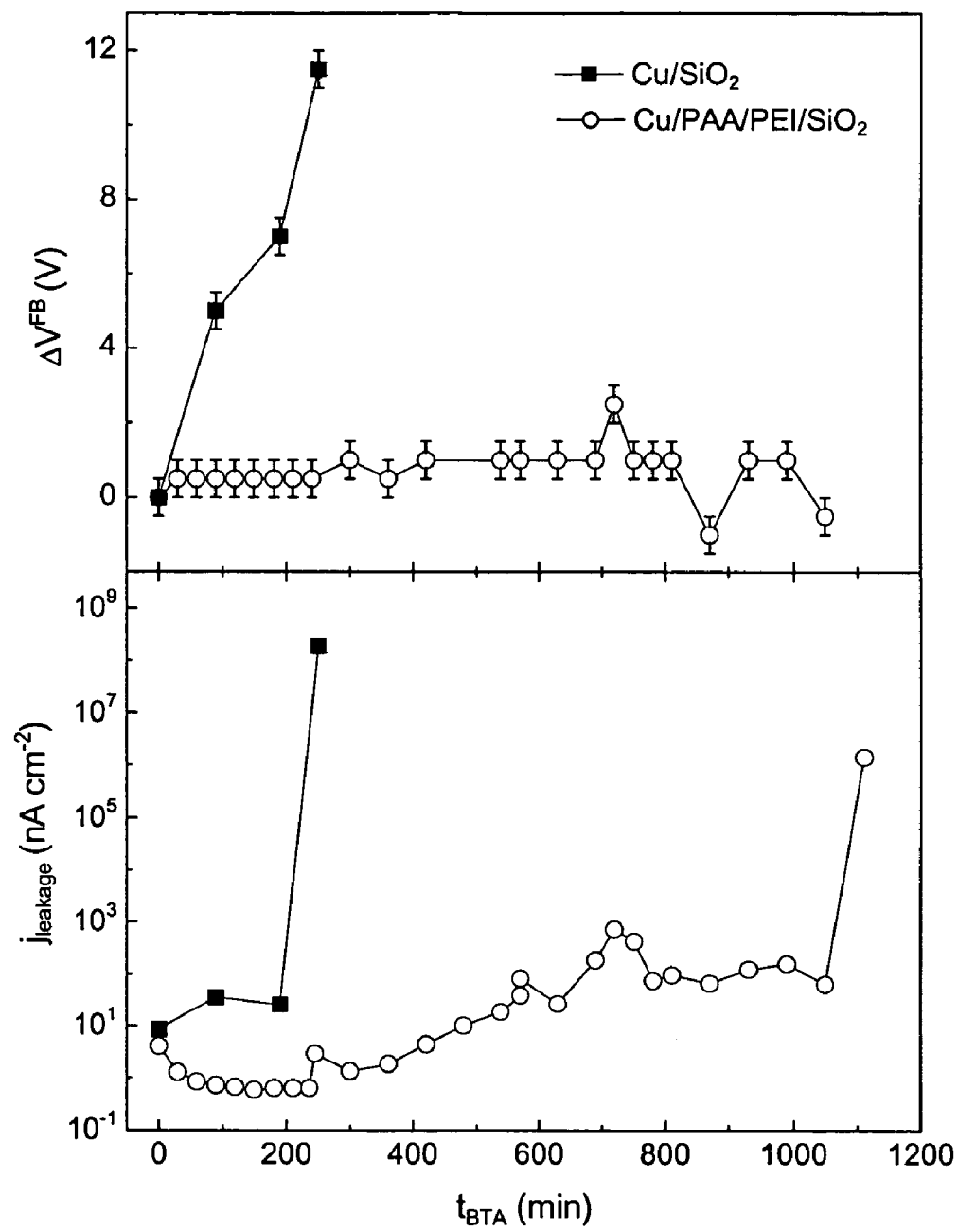
FIG. 2 is a graph showing comparisons of Cu/SiO$_2$ structure (no diffusion barrier) with structures having a diffusion barrier according to the present invention, namely Cu/PAA/PEI/SiO$_2$. Plots are of t$_{BTA}$ (time of Bias thermal annealing) vs. $\Delta V^{FB}$ (Flatband voltage shift) (top) and t$_{BTA}$ vs. j$_{leakage}$ (leakage current) (bottom)

FIG. 2A plots $\Delta V^{FB}$ and $j_{leakage}$ values as a function of BTA time ($t_{BTA}$), for MOS structures with (circles) and without (solid squares) a PAA/PEI bilayer at the Cu/SiO2 interface. FIG. 2A shows that, in Cu/$SiO_2$/Si/Al structures without the bilayer, $\Delta V^{FB}$ rapidly increases with tBTA reaching ~7 V at ~190 min. In contrast, the flatband voltage of structures with a PAA/PEI bilayer are nearly constant: $\Delta V^{FB}$ is <1 V even at 1050 min. These results show that the present diffusion barrier prevents Cu migration that would cause a shifting of the flat band voltage.

These results bear a strong correlation with the $j_{leakage}$–$t_{BTA}$ characteristics for the same two types of MOS structures, as shown in FIG. 2B. In the control sample (solid squares), $j_{leakage}$ rapidly increases to values >$10^3$ nA/cm$^2$ at $t_{BTA}$~190 min, indicating the dielectric breakdown of $SiO_2$ due to Cu ion drift [Ref. 15]. The $jl_{eakage}$ in MOS capacitors with the polymer bilayer was only ~10 nA/cm$^2$ up to $t_{BTA}$=1050 min, beyond which the SiO$_2$ dielectric breakdown occurs. Thus, the use of a PAA/PEI bilayer at the Cu/SiO$_2$ interface increased the time to SiO$_2$ breakdown by more than a factor of 5. At $t_{BTA}$ corresponding to SiO$_2$ breakdown in the control sample, the $j_{leakage}$ in samples with the polyelectrolyte bilayers is more than 5 orders of magnitude smaller. These results indicate that a PAA/PEI bilayer inhibits Cu transport into SiO$_2$.

B. Triangular Voltage Sweep Measurements

In order to confirm the diffusion of Cu into SiO$_2$, TVS (triangular voltage sweep) was carried out on Cu/PAA/PEI/ SiO2/Si/Al MOS structures before and after BTA.

Figure 3:
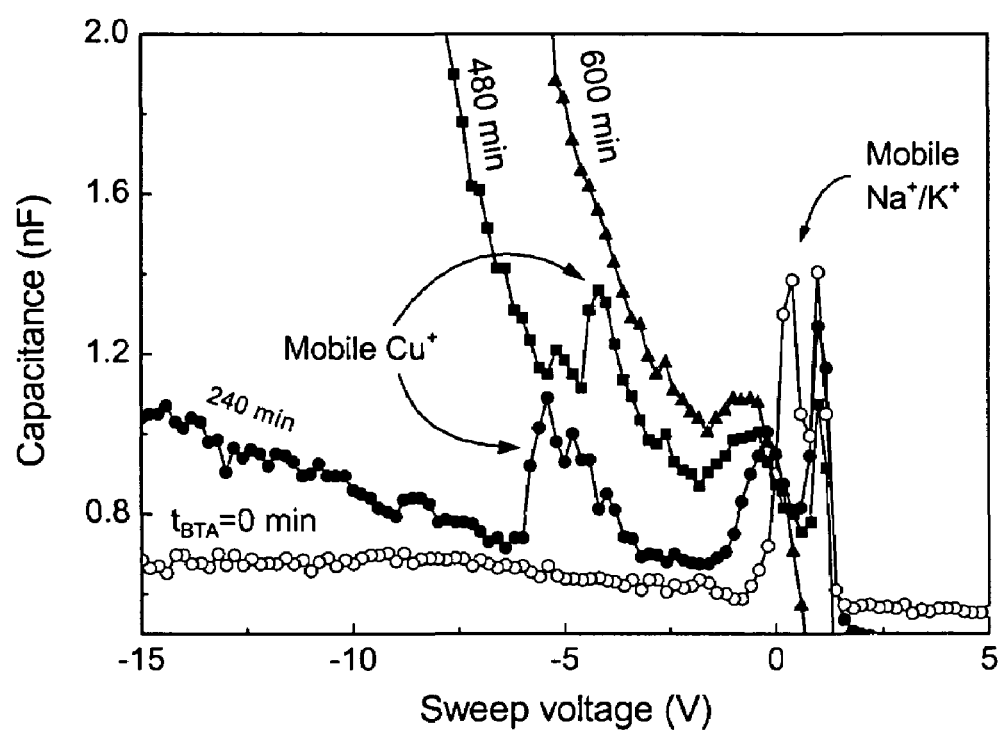
FIG. 3 is a graph of TVS plots obtained at different t$_{BTA}$ values at a 0.02 V/s sweep rate for Cu/PAA/PEI/SiO$_2$/Si/Al capacitors annealed at 200° C. in a 2 MV/cm electric field.

FIG. 3 compares the TVS spectrum of the sample before and after 240 min BTA. At $t_{BTA}$=0 the TVS spectrum shows a feature at around 0 V indicating the presence of residual Na$^+$/K$^+$ type mobile ions in the dielectrics [Ref. 16]. Upon annealing for ~240 min, a distinct peak corresponding to mobile Cu ions [Ref. 017] appears at ~−5 V, indicating that the leakage current during initial stages of BTA (FIG. 2) arises mainly from Cu ion drift. While further annealing (480 min. and 600 min.) increases the intensity of this peak, it is relatively small and is obscured by the leakage current increase due to the onset of other degradation mechanisms in SiO$_2$ (see FIG. 2).

C. Alternative Layer Structures

Figure 4:
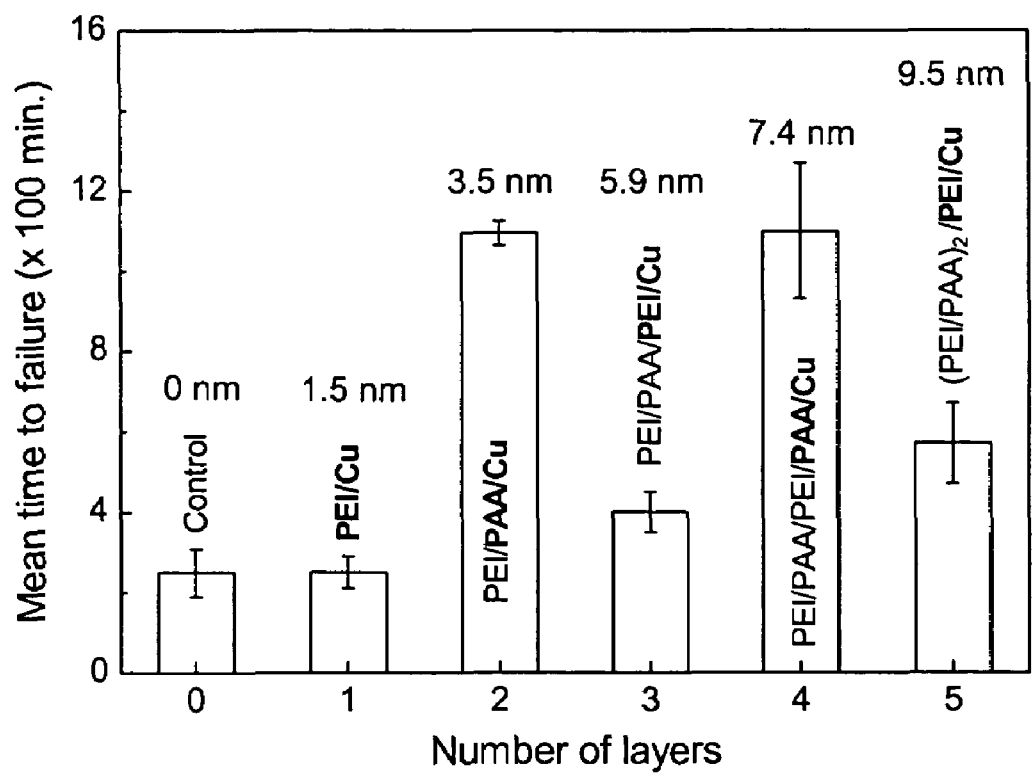
FIG. 4 is a bar graph showing dielectric breakdown times of Cu/SiO$_2$/Si/Al MOS structures plotted as a function of the number of polyelectrolyte layers made according to the present invention.

BTA tests of MOS structures with multilayer barriers, consisting of different number of alternating PAA and PEI layers at the Cu/SiO$_2$ interface, were studied to obtain insights into the mechanism of inhibition of Cu transport. FIG. 4 shows the time of SiO$_2$ breakdown for MOS structures as a function of total thickness of polyelectrolyte layers of different thicknesses. The results show no significant differences in failure times of MOS structures with a PAA/ PEI bilayer (bar 2) and those with a PAA/PEI/PAA/PEI quadruple layer (bar 4). In both these cases, the PAA polyanionic layer is in contact with Cu. In contrast, MOS structures with 3 and 5 polyelectrolyte layer barriers, namely, PEI/PAA/PEI (bar 3) and PEI/PAA/PEI/PAA/PEI (bar 5)—both of which have PEI in contact with Cu, show a factor-of-2 lower failure time compared to bilayers and quadruple layer barriers. These results strongly suggest that the Cu/polyelectrolyte interface chemistry is a major factor in blocking Cu diffusion. In particular, the layer in contact with the Cu should be polyanionic.

D. XPS Data

In order to investigate if Cu ions are immobilized by PAA, the chemistry of the Cu/PAA interface was studied physically. Cu/PAA/PEI/SiO$_2$/Si structures subject to four-point bending [Ref. 8] delaminate at the PEI/SiO$_2$ interface. The retention of the Cu/PAA/PEI structure on one end of the fracture surface suggests attractive interactions between Cu and PAA.

Figure 5:
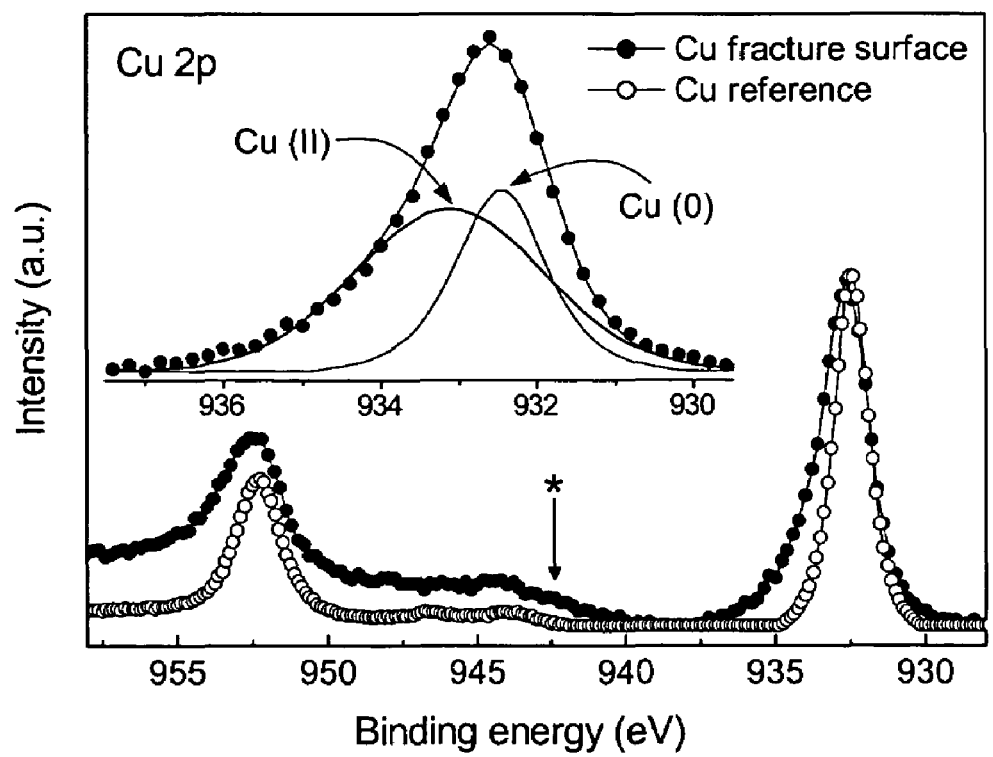
FIG. 5 shows representative x-ray photoelectron spectroscopy (XPS) plots as binding energy vs. intensity of emitted photons for known elemental forms of copper and the same energy region in spectrum (the vicinity of the Cu 2p band) obtained from a Cu/PAA/PEI fracture surface (closed circles).

XPS (x-ray photoelectron spectroscopy) Cu 2p$_{3/2}$ spectra collected from the PAA/PEI side of the Cu/PAA/PEI fracture surface is shown in FIG. 5.

The closed circles represent an XPS spectrum in the vicinity of the Cu 2p band obtained from a Cu/PAA/PEI fracture surface. The "*" points to the expected Cu(II) satellite peak position for Cu oxides, which is absent in these data. A reference spectrum from an elemental Cu surface after sputtering away the surface oxide layer is also shown (open circles). The insert shows a high resolution spectrum of the Cu 2P$_{3/2}$ band with the two sub-band components.

As shown at the asterisk, the data show a higher binding energy component in addition to the Cu(0) state at ~932.5 eV observed in Cu reference surfaces obtained by sputtering the oxide layer. The inset shows the two Cu 2p$_{3/2}$ component sub-bands superimposed on a high-resolution spectrum obtain from a Cu/PAA/PEI fracture surface. The higher binding energy band centered at ~933.2 eV is consistent with the reported peak position of Cu(II) sub-band in Cu oxides [Ref. 19]. The intensity of the satellite peaks typically observed in Cu(II) oxides [Refs. 19, 20] is negligible (see arrow at the expected location), indicating the absence of the Cu-oxides at the Cu/PAA interface. The absence of oxides at the Cu/PAA interface suggests that any surface oxide that may have been present is reduced by the PAA overlayer to a Cu(0)-like state, but with a higher binding energy than Cu(0) from pure Cu (see below for more details). Such an interaction that hinders the ionization of Cu, curtails copper transport (Cu ions are known to be the main diffusing species in these dielectric materials).

Without wishing to be bound by any scientific theory, it is believed that the Cu-(0)-like Cu(II) state, i.e., without the satellites, arises from polychelation between Cu, and oxygen from the —COOH groups of the PAA. This results in a higher binding energy Cu(0) peak compared to that of elemental Cu. Satellite peaks in Cu oxides and Cu-coordination compounds arise due to poor core-hole charge screening by electrons in the Cu 3 d states [Ref. 21]. However, with the present barriers, the lone-pairs of electrons from several carboxyl groups in the PAA may create a metal-like atmosphere consisting of delocalized electrons on the surface that screen the core-hole charge. This results in a Cu(II) band without satellite peaks—much like the Cu(0) band in elemental Cu, but at a higher binding energy. The above results are consistent with previous works showing polychelation between Cu and carboxyl groups in PAA [Refs. 010,11] in the liquid phase. Inducing interfacial poly-chelation could be a potential tool to offset degradation of barrier properties that have been attributed to interfacial oxygen in metal/polymer structures [Ref. 22].

The poly-chelation of Cu with PAA at the Cu/PAA interface in PAA-terminated bilayers or multilayers provides a mechanism for immobilizing Cu and inhibiting its diffusion across the barrier layers. In the case of PEI-terminated multilayers, PAA anions are not in direct contact with Cu for polychelation to occur. Moreover, electrostatic coupling of carboxyl groups of PAA with amine groups of the top and bottom PEI layers decrease the density of carboxyl groups available for chelation, and hence are ineffective in immobilizing Cu ions. This feature is manifest in the barrier characteristics being independent of the number of layers even in cases where PAA is the top layer. For example, PAA/PEI/PAA/PEI quadruple layer barriers do not yield larger failure times than the PAA/PEI bilayers, indicating that the PAA layers in the middle of a multilayer structure do not play any significant role. In the case of 3 and 5 layer structures, the bonding interaction between Cu and the PEI cation layer is weak, and hence the blocking of Cu ions is ineffective.

SUMMARY

In summary, it is demonstrated that sub-5-nm-thick layers comprising PAA/PEI polyelectrolyte bilayers are attractive candidates for inhibiting Cu diffusion across Cu/SiO$_2$ interfaces. Immobilization of Cu through poly-chelation between Cu and carboxyl groups in PAA, at the Cu/PAA interface, is believed to be the primary barrier mechanism. In this particular case, multilayering does not further improve the barrier properties that than exhibited by a single PAA/PEI bilayers. In fact, multilayers having a PEI layer in contact with the Cu actually degrades barrier properties. However, the use monolayers or multilayers of polyelectrolytes, that contain appropriately chosen functional groups, to yield similar properties when applied in layers with functionalties that are electrolytically attractive, as described above is feasible.

For example, according to the above description, one could functionalize a substrate such as silicon with a positively charged material (e.g. phosphorous) and then depositing a polyanion (e.g. PAA). Other layers could be added, or the metal (e.g. copper) conductive layer could be deposited directly on the polyanionic layer.

Cationic polyelectrolytes containing other electron-donating functional groups such as mercapto (SH), ethanol (OH), and benzyl (aromatic) can be used instead of PAA. Additionally, covalently linking polyelectrolytes such as polystyrene maleic anhydride (PSMA) or polyoctadecene maleic anhydride (POMA) can be used. The anhydride groups on PSMA and POMA covalently crosslink with polyelectrolytes such as PEI, and allow subsequent functionalization of the PSMA or POMA layer.

Alternative methods of surface treatment are known in the art, as exemplified, for example, in U.S. Pat. No. 6,521,300.

An important consequence of the present work is that it is possible to design ultrathin (e.g., <3 nm) molecular layers that inhibit diffusion through strong, highly local, chemical interactions at the interface. This implies that thinner barriers can be as good as thicker versions of the same materials. The present work is expected to open up new avenues for improving the integrity of metal/dielectric interfaces, and barrier-less polymeric dielectrics, and isolating nanoscale components in newly evolving device systems.

REFERENCES

1. S. P. Murarka, Mater. Sci. Eng., R. 19, 87 (1997).
2. A. E. Kaloyeros and E. Eizenbraun, Annu. Rev. Mater. Sci. 30, 363 (2000).
3. G. Ramanath, J. R. A. Carlsson, J. E. Greene, L. H. Allen, V. C. Horn-back, and D. J. Allman, Appl. Phys. Lett. 61, 3179 (1996).
4. A. Krishnamoorthy, K. Chanda, S. P. Murarka, and G. Ramanath, Appl. Phys. Lett., 78 (2001) 2467.
5. G. Ramanath, G. Cui, P. G. Ganesan, X. Guo, A. V. Ellis, M. Stukowski, K. Vijayamohanan, P. Doppelt and M. Lane, Appl. Phys. Lett., (2003) in press.
6. F. T. Wall, S. J. Gill, J. Phys. Chem. 58, 1128 (1954).
7. H. P. Gregor, L. B. Luttinger, E. M. Loebl, J. Phys. Chem. 59, 34 (1955).
8. A. M. Kotliar, H. Morawetz, J. Am. Chem. Soc. 77, 3692 (1955).
9. H. Yokoi, S. Kawata, M. Iwaizumi, J. Am. Chem. Soc. 108, 3361 (1986).
10. J. Francois, C. Heitz, M. M. Mestdagh, Polymer 38, 5321 (1997).
11. B. L. Rivas, N. Schiappacasse, L. A. Basaez, Polymer Bulletin, 45, 259 (2000).
12. S. Joly, R. Kane, L. Radzilowski, T. Wang, A. Wu, R. E. Cohen, E. L. Thomas, M. F. Rubner, Langmuir 16, 1354 (2000).
13. G. Decher, Science 277, 1232 (1997).
14. R. K. Iler, J. Colloid Interface Sci. 21, 569 (1966).
15. R. Tsu, J. W. McPherson, and W. R. McKee, in Proceedings of the International Reliability Physics Symposium, IEEE, p. 348, New York (2000).
16. N. D. Young, A. Gill, and I. R. Clarence, J. Appl. Phys. 66, 187 (1989).
17. A. Mallikarjunan, S. P. Murarka, and T. M. Lu, J. Electrochem. Soc., 141, 1862 (1994).
18. R. H. Dauskardt, M. Lane, Q. Ma, and N. Krishna, Eng. Fract. Mech. 61, 141 (1998).
19. S. K. Chawla, N. Sankarraman and J. H. Payer, J. Electron Spectros. Relat. Phenom. 61, 1 (1992).
20. A. E. Bocquet, T. Mizokawa, T. Saitoh, H. Namatame, and A. Fujimori, Phys. Rev. B 46, 3771 (1992).
21. K. Okada, J. Kawai, and A. Kotani, Phys. Rev. B 48, 10733 (1993).
22. See A. Mallikarjunan, S. P. Murarka, and T.-M. Lu, Appl. Phys. Lett. 79, 1855 (2001) and references therein.

What is claimed is:

1. A semiconductor device comprising:
   (a) a substrate;
   (b) at least one polyelectrolyte layer on the substrate; and
   (c) a conductive metal layer on a polyelectrolyte layer.

2. The device of claim 1 wherein the substrate has been functionalized to possess a surface charge.

3. The device of claim 2 wherein the polyelectrolyte layer comprises at least a first polyelectrolyte layer comprising a polyion having a charge opposite to the surface charge of the substrate.

4. The device of claim 3 wherein the substrate has a negative surface charge and a contacting layer comprises a polycationic layer.

5. The device of claim 1 wherein the metal layer comprises a copper layer.

6. The device of claim 1 wherein the polyelectrolyte layer is less than about 5 nanometers thick.

7. The device of claim 1 wherein the substrate comprises silicon and silicon oxide.

8. The device of claim 7 wherein the substrate has been functionalized to possess a surface charge.

9. The device of claim 8 wherein the polyelectrolyte layer comprises at least a first polyelectrolyte layer comprising a polyion having a charge opposite to the surface charge of the substrate.

10. The device of claim 8 wherein the polyelectrolyte in contact with the metal layer is polyanionic.

11. A method for forming an electrical device, the method comprising:
    (a) providing a substrate;
    (b) forming at least one polyelectrolyte layer on the substrate; and
    (c) forming a metal layer on the at least one polyelectrolyte layer.

12. The method of claim 11 wherein the at least one polyelectrolyte layer comprises at least a first polyelectrolyte layer comprising a polycation and a second polyelectrolyte layer comprising a polyanion.

13. The method of claim 11 wherein the metal layer is a copper layer.

14. The method of claim 11 wherein the polyelectrolyte layer is formed as less than about 5 nanometers thick.

15. The method of claim 11 wherein the substrate comprises silicon and silicon oxide.

16. The method of claim 13 further comprises the step of forming a polycationic layer on the substrate.

17. The method of claim 13 further comprising the step of forming a polyanionic layer on the polycationic layer.

18. An integrated circuit comprising a substrate, a metal layer, and a diffusion barrier in between, wherein the diffusion barrier comprises a polymeric layer less than 10 nm thick, wherein said polymeric layer comprises polymers having primary amines contacting the substrate and pendant organic acidic groups contacting the metal.

19. The diffusion barrier according to claim 18, wherein the diffusion barrier is less than 5 nm thick.

20. The diffusion barrier according to claim 18, wherein the diffusion barrier comprises a polyionic layer selected from the group consisting of a polyanionic layer, a polycationic layer, and adjacent polyanionic and polycationic layers.

21. The diffusion barrier according to claim 18, wherein the polymeric layer comprises PAA and PEI.

22. The diffusion barrier according to claim 18 comprising a cationic polyelectrolyte containing electron-donating functional groups selected from the group consisting of s mercapto (SH), ethanol (OH), benzyl (C6H5) and carboxyl (COO).

23. The diffusion barrier according to claim 22 comprising an anionic polyelectrolyte selected from the group consisting of polystyrene maleic anhydride (PSMA), polyoctadecene maleic anhydride (POMA) and PAA.

24. The diffusion barrier according to claim 18, wherein the diffusion barrier contacts a low k dielectric substrate that has been treated prior to application of the polyelectrolyte layer to comprise surface anionic groups.

* * * * *